United States Patent [19]
Tamai et al.

[11] Patent Number: 4,994,674
[45] Date of Patent: Feb. 19, 1991

[54] ION IMPLANTATION APPARATUS CAPABLE OF AVOIDING ELECTRIFICATION OF A SUBSTRATE

[75] Inventors: Tadamoto Tamai, Tokyo; Junichi Murakami, Ehime, both of Japan

[73] Assignee: Sumitomo Eaton Nova Corporation, Tokyo, Japan

[21] Appl. No.: 520,557

[22] Filed: May 8, 1990

[30] Foreign Application Priority Data

May 9, 1989 [JP] Japan .................................. 1-114097
May 19, 1989 [JP] Japan .................................. 1-124518

[51] Int. Cl.[5] ............................................ H01J 37/317
[52] U.S. Cl. ................................. 250/492.2; 250/398
[58] Field of Search ............ 250/492.21, 492.2, 492.3, 250/398

[56] References Cited

U.S. PATENT DOCUMENTS 4,783,597 11/1988 Misawa et al. .................... 250/492.2
4,914,292 4/1990 Tamai et al. ....................... 250/492.2

*Primary Examiner*—Jack I. Berman
*Attorney, Agent, or Firm*—Burns, Doane, Swecker & Mathis

[57] ABSTRACT

In an ion implantation apparatus which is for use in injecting an ion beam (11) onto a wafer (12) in a predetermined direction and which comprises an electric conductor tube (14) divided into a first tube section (17) and a second tube section (18) along the predetermined direction with an insulator interposed therebetween. The first tube section is located in proximity of the wafer and is grounded while the second tube section is remote from the wafer to be used as a target section which is bombarded by primary electrons to generate secondary electrons directed to the wafer. Undesired electrons are trapped by the first tube section and flow through the ground.

The electric conductor tube may further comprise a third tube section (21) which is electrically insulated from the second tube section and which is remote from the wafer in comparison with the second tube section in the predetermined direction. The first and the third tube sections are controlled so as to adjust their diameters in dependency upon a diameter of the ion beam.

7 Claims, 8 Drawing Sheets

ION IMPLANTATION APPARATUS CAPABLE OF AVOIDING ELECTRIFICATION OF A SUBSTRATE

BACKGROUND OF THE INVENTION

This invention relates to an ion implantation apparatus for injecting an ion beam into a substrate.

On injecting an ion beam into a substrate or a wafer, the substrate is positioned on a disk section and is directed to the ion beam. When the ion beam is irradiated onto the substrate, a positive electric charge may be electrified on a surface of the substrate. Therefore, it is necessary to remove the positive electric charge from the substrate.

A conventional ion implantation apparatus is disclosed in Japanese Unexamined Patent Publication No. 10563/1989 (Tokkai Hei 1-10563) filed by the present assignee. In the conventional ion implantation apparatus, an ion beam is irradiated onto a substrate along a predetermined direction which may be called an irradiating direction hereinafter. Specifically, the conventional ion implantation apparatus comprises an electric conductor tube which is extended towards the irradiating direction and which has an inner wall. The inner wall is used as a target section for emitting electrons. An electron supplying section supplies primary electrons towards the target section to make the target section emit secondary electrons.

The secondary electrons are transferred in the form of an electron beam to the substrate through the electric conductor tube. As a result, it is possible to remove the positive electric charge from the substrate.

By the way, a secondary current is generated in the electric conductor tube when the secondary electrons are emitted from the target section. An amount of the secondary current is proportional to that of the secondary electrons. In addition, the amount of the secondary electrons is proportional to that of the primary electrons sent from the electron supplying section. This shows that the secondary current has to depend on the amount of the primary electrons. Therefore, it may be possible for the electron supplying section to substantially control the amount of the secondary electrons by detecting the amount of the secondary current.

However, undesired electrons are practically emitted from the substrate when the ion beam is irradiated to the substrate. The undesired electrons collide with an inner wall surface of the electric conductor tube. Such collision of the undesired electrons brings about a drastic change of the secondary current. As a result, it is practically difficult to suitably control the amount of the secondary electrons when a change of the secondary current is considered. In other words, the electron supplying section can not accurately control the amount of the secondary electrons. Therefore, it is difficult to avoid electrification of the substrate.

SUMMARY OF THE INVENTION

It is an object of the invention to provide an ion implantation apparatus which is capable of suitably controlling an amount of secondary electrons.

It is another object of the invention to provide an ion implantation apparatus which is capable of removing positive electric charge from a substrate.

Other objects of this invention will become clear as the description proceeds.

An ion implantation apparatus to which this invention is applicable is for injecting an ion beam into a substrate by guiding the ion beam in a predetermined direction. The substrate is located on a disk section transversely of the predetermined direction. The ion implantation apparatus comprises an electric conductor tube which is extended along the predetermined direction and which has an inner wall operable as a target section and electron supplying means for supplying the target section with a primary electron to emit a secondary electron from the target section to thereby irradiate the secondary electron to the substrate. According to this invention, the electric conductor tube comprises a first tube section located in proximity of the disk section, a second tube section which is electrically insulated from the first tube section and which is remote from the disk section in comparison with the first tube section in the predetermined direction, and ground means for grounding the first tube section to ground.

DESCRIPTION OF THE PREFERRED EMBODIMENTS

Figure 1:
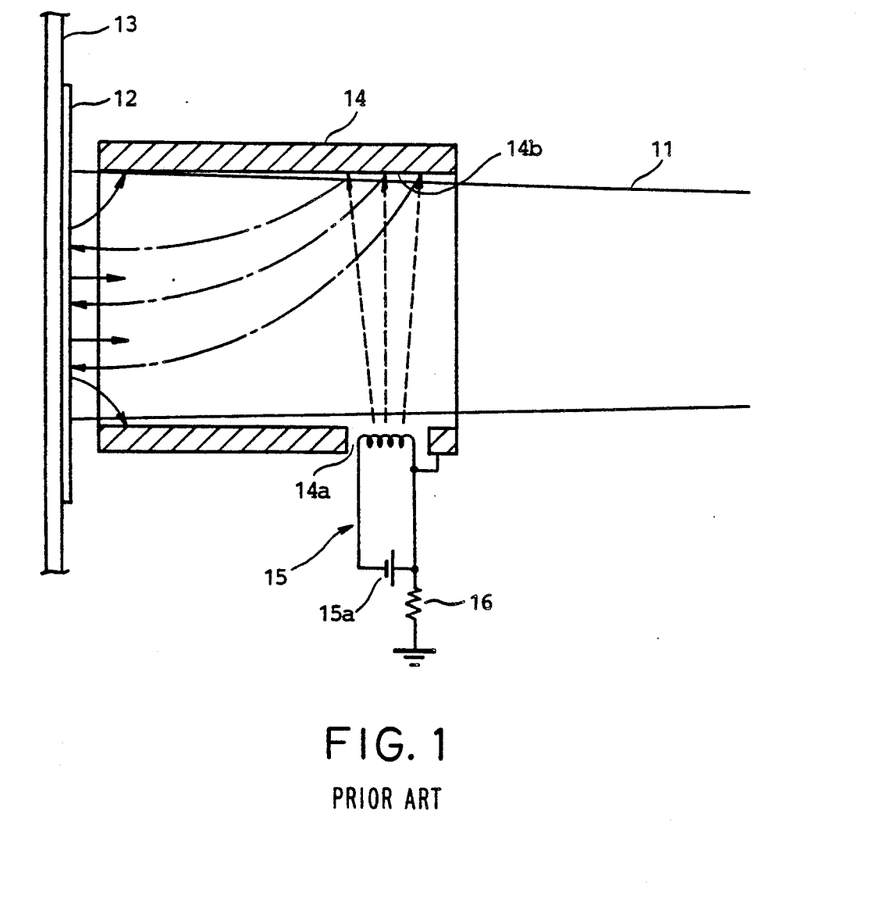
FIG. 1 is a side view, partially in section, of a conventional ion implantation apparatus.

Referring to FIG. 1, description will be made as regards a conventional ion implantation apparatus for a better understanding of this invention. The illustrated ion implantation apparatus is for injecting an ion beam into a substrate. To this end, the ion beam 11 is generated by an ion source (not shown) and is guided in a predetermined direction which may be called an irradiating direction hereinafter. A wafer 12 is disposed as the substrate on a disk shaped plate 13 and is located transversely of the irradiating direction. The ion implantation apparatus comprises an electric conductor tube 14, for example, of aluminum, which is extended along the irradiating direction and which defines an irradiating path for irradiating the ion beam 11 therein.

The electric conductor tube 14 has an opening part 14a at an intermediate part of the tube 14. An electron gun 15 is located within the opening part 14a and directed towards the inner wall surface of the electric conductor tube 14. This shows that the inner wall surface of the electric conductor tube 14 is partially used as a target section 14b as will be described hereinafter. The electric conductor tube 14 is grounded through a first resistor 16.

When the ion beam 11 is irradiated onto a surface of the wafer 12 through the irradiating path, a positive electric charge is inevitably electrified or charged on a surface of the wafer 12.

Under the circumstances, an electric voltage is applied from a voltage source 15a to the electron gun 15. As a result, the electron gun 15 emits a beam of primary electrons towards the target section 14b. Bombarded by the primary electron beam, the target section 14b emits a beam of secondary electrons which travels in the form of an electron beam towards the wafer 12 together with the ion beam 11. The positive electric charge is neutralized by irradiation of the electron beam and, as a result, is extinct from the surface of the wafer 12.

In order to completely neutralize the positive electric charge on the surface of the wafer 12, the electron gun 15 must be accurately controlled. However, such control of the electron gun 15 is very difficult. More specifically, let a primary electron current be caused to flow through the electron gun 15 in FIG. 1 by supplying the electric voltage from the voltage source 15a to the electron gun 15. On the other hand, a secondary electron current is also caused to flow through the electric conductor tube 14 in proportion to the amount of the secondary electrons resulting from the primary electrons. The secondary electron current flows through the first resistor 16 to the earth because the electric conductor tube 14 is electrically connected to the electron gun 15. Therefore, it is possible to detect the amount of the secondary electron current by measuring a resistor voltage across the first resistor 16. Thus, the amount of the secondary electrons can be detected by measuring the resistor voltage. This is because the amount of the secondary electrons is proportional to that of the primary electron current which flows through the first resistor 16. This shows that it is fundamentally possible to control the amount of the secondary electrons by adjusting the amount of the primary electron current.

Practically, undesired electrons are very often emitted from the wafer 12 when the ion beam 11 is irradiated onto the wafer 12. The undesired electrons collide with the inner wall surface of the electric conductor tube 14 in proximity of the disk shaped plate 13.

Figure 2:
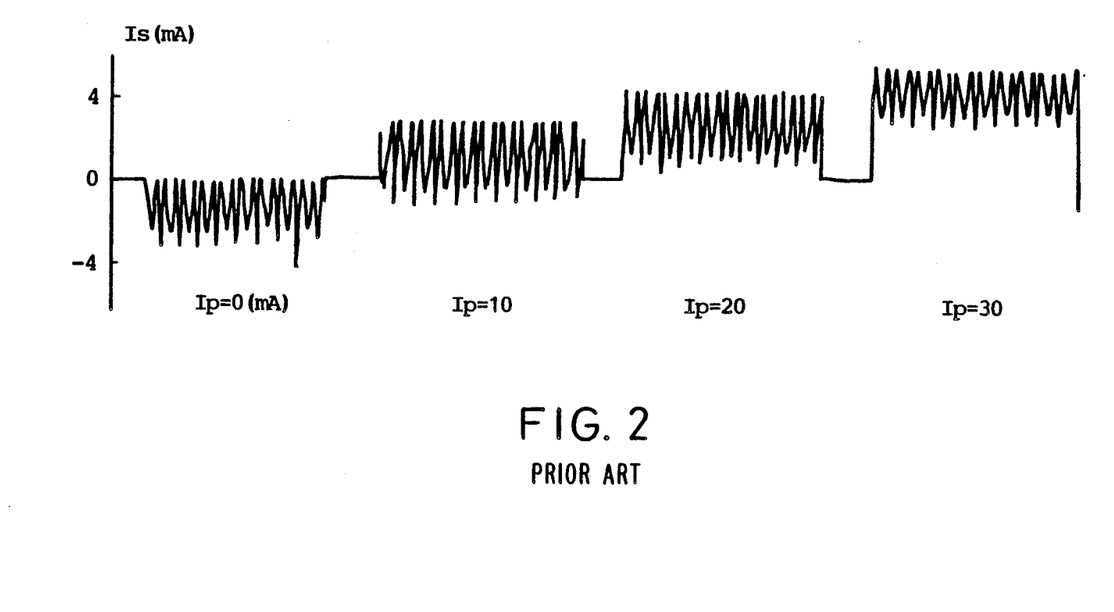
FIG. 2 is a graph for illustrating the amount of a secondary current in the conventional ion implantation apparatus of FIG. 1.

Referring to FIG. 2 together with FIG. 1, a relationship between the primary and the secondary electron currents is illustrated along a time axis on the assumption that the ion beam of boron fluoride (BF$_2$) is accelerated by the use of the ion source of 40 keV and that a current of 4 mA flows due to the ion beam of boron fluoride. At first, let the primary electron current (depicted at Ip) supplied to the electron gun 15 be equal to 0 mA. In this case, the secondary electron current (depicted at Is) measured through the first resistor 16 is less than 0 mA and is intensely varied between 0 mA and about −4 mA, as illustrated on the leftmost side of FIG. 2. When the primary electron current (Ip) is equal to 10 mA, the secondary electron current (Is) is shifted to a range smaller than 4 mA and is intensely varied. Similarly, the secondary electron current (Is) becomes high in comparison with the case of Ip=10 mA and is varied when the primary electron current (Ip) is equal to 20 mA and 30 mA. As shown in FIG. 2, the secondary electron current (Is) is alternatingly varied within the range of about ±4 mA in the conventional ion implantation apparatus. Such variation of the secondary electron current (Is) results from the undesired electrons emitted from the wafer 12.

Thus, the secondary electron current is changed by the undesired electrons, as shown in FIG. 2. Therefore, the secondary electron current is not accurately proportional to the primary current. It is difficult to suitably control the amount of the secondary electrons.

Figure 3:
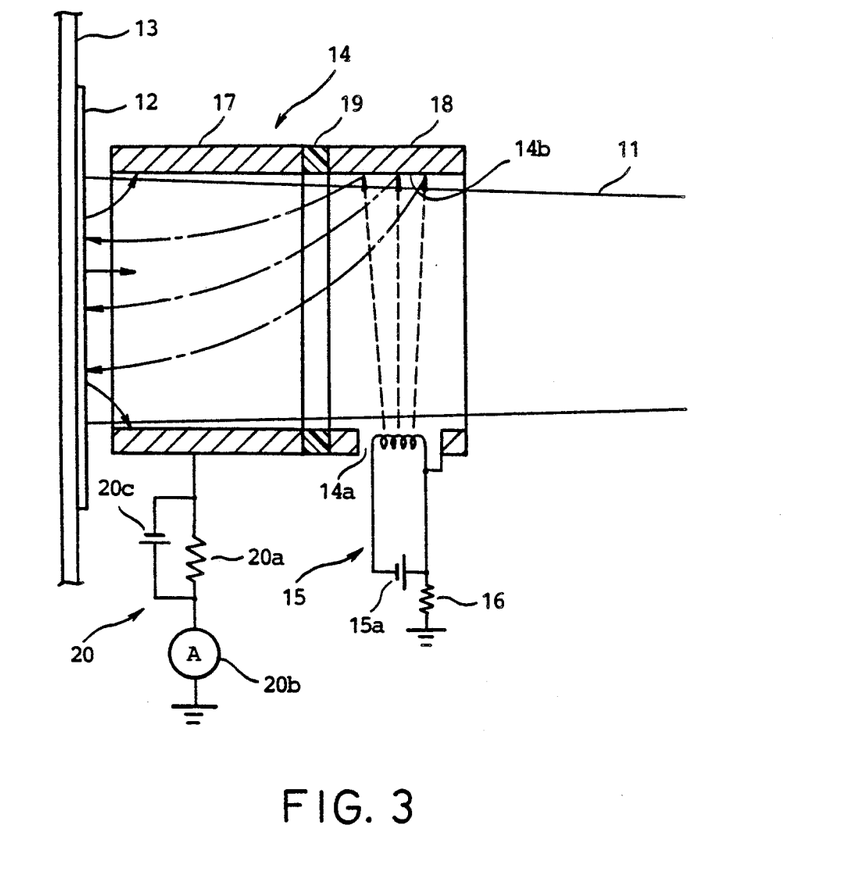
FIG. 3 is a side view, partially in section, of an ion implantation apparatus according to a first embodiment of this invention.

Referring to FIG. 3, description will proceed to an ion implantation apparatus according to a first embodiment of this invention. The illustrated ion implantation apparatus comprises similar parts which are designated by like reference numerals.

In FIG. 3, the electric conductor tube 14 is divided axially or in the irradiating direction into a first tube section 17 and a second tube section 18 with a first circular insulator 19 interposed between the first and the second tube sections 17 and 18. The first tube section 17 is located in proximity of the disk shaped plate 13. The second tube section 18 is remote from the disk shaped plate 13 in comparison with the first tube section 17. The first and the second tube sections 17 and 18 are electrically insulated from each other by the first circular insulator 19.

In FIG. 3, the first tube section 17 is connected to a ground section 20 to be grounded through the ground section 20. The ground section 20 comprises a ground resistor 20a, a galvanometer 20b, and a bias voltage source 20c connected parallel to the ground resistor 20a.

Like in FIG. 1, a primary electron current is caused to flow through the electron gun 15 by supplying an electric voltage from the voltage source 15a to the electron gun 15. As a result, primary electrons are emitted from the electron gun 15 to the target section 14b formed by the second tube section 18 so that secondary electrons are emitted from the target section 14b. The secondary electrons travel towards the wafer 12 along the irradiating path together with the ion beam and impinge onto the wafer 12. As a result, the positive electric charge is neutralized by impingement of the secondary electrons. Consequently, the positive electric charge is extinct from the surface of the wafer 12. In this event, undesired electrons are also emitted from the wafer 12 by collision of the ion beam 11 like in FIG. 1.

Since the ion beam 11 is guided from a rightward side to a leftward side of FIG. 3 and the undesired electrons have charges different from the ion beam 11, the undesired electrons can hardly run over a wide zone in an inverse direction from the leftward side to the rightward side of FIG. 3 along the irradiating path. Therefore, the undesired electrons almost fall within and collide with the first tube section 17. When the undesired electrons collide with the first tube section 17, an undesired electron current is generated due to collision of the undesired electrons in the first tube section 17.

Since the first tube section 17 is insulated from the second tube section 18 by the first insulator 19, it is to be noted that the undesired electron current does not flow into the second tube section 18. As a result, the undesired electron current flows to the ground through the ground resistor 20a and the galvanometer 20b and can be detected by the galvanometer 20b.

Figure 4:
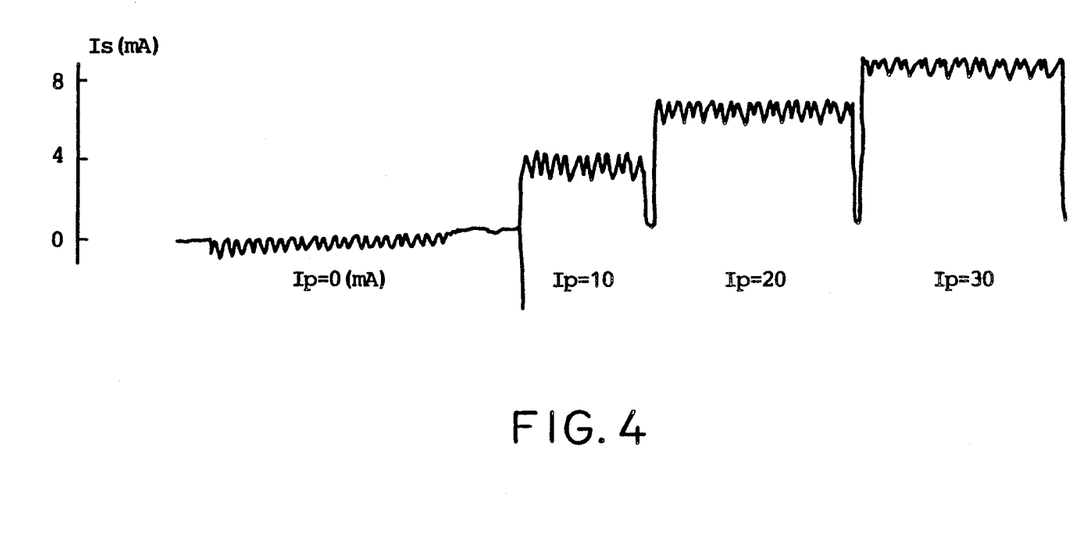
FIG. 4 is a graph for illustrating the amount of a secondary current in the ion implantation apparatus of FIG. 4.

Referring to FIG. 4 together with FIG. 3, it is assumed that a boron fluoride ion beam is used as the ion beam in the ion implantation apparatus illustrated in FIG. 3. The boron fluoride ion beam is produced and accelerated to 40 keV by an ion source (not shown). When the primary electron current (Ip) is equal to 0 mA, the secondary electron current (Is) is slightly undulated in a region adjacent to 0 level. Even when the primary electron current (Ip) is increased to 10 mA, 20 mA, and 30 mA, the secondary electron current (Is) is slightly undulated in regions adjacent to 4 mA, 6 mA, and 8 mA, respectively.

At any rate, a variation of the secondary electron current is remarkably reduced in accordance with the ion implantation apparatus illustrated in FIG. 3. This means that the undesired electrons almost collide with the first tube section 17 and scarcely collide with the second tube section 18. Therefore, the secondary electron current is hardly varied in the second tube section 18, as shown in FIG. 4. This facilitates to control the amount of the secondary electrons which are emitted from the second tube section 18.

Figure 5:
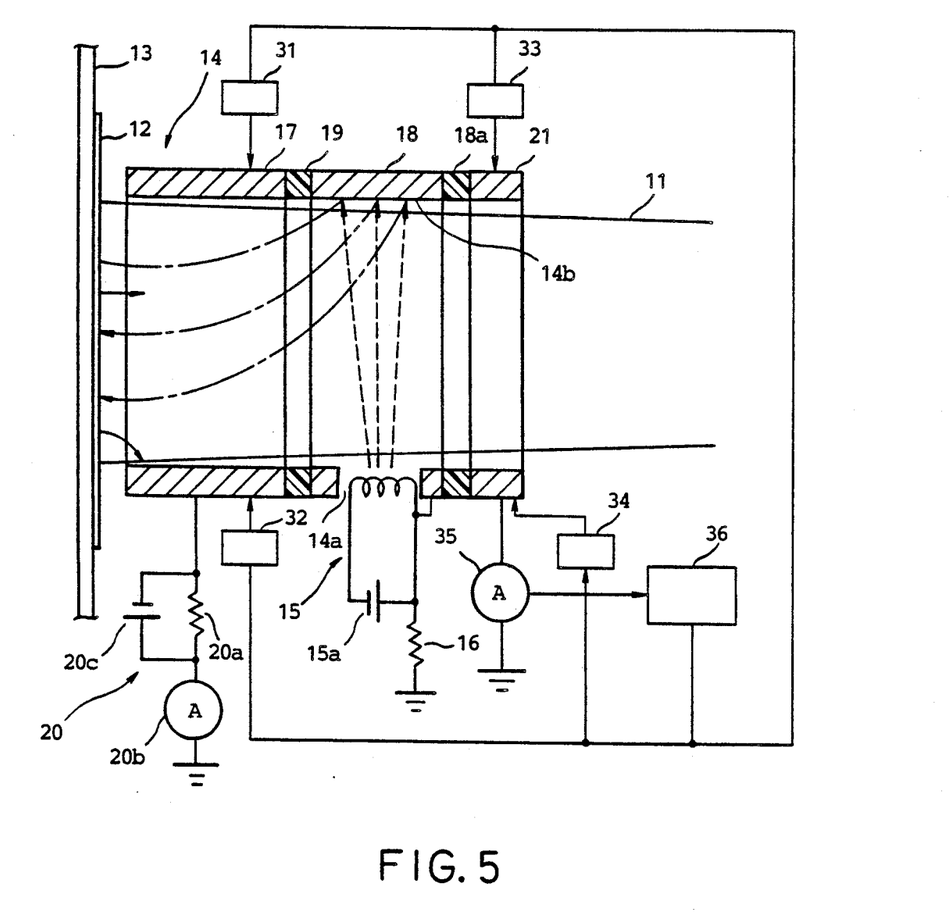
FIG. 5 is a side view, partially in section, of an ion implantation apparatus according to a second embodiment of this invention.

Referring now to FIG. 5, description will be directed to an ion implantation apparatus according to a second embodiment of this invention. In the second embodiment, the ion implantation apparatus is similar in structure and operation to that illustrated in FIG. 3 except that the electric conductor tube 14 further comprises a third tube section 21 which is electrically isolated from the second tube section 18 by a second insulator 18a. The third tube section 21 is located on the righthand side of the second tube section 18 and is farther from the disk shaped plate 13 than the second tube section 18 along the irradiating direction.

Figure 6:
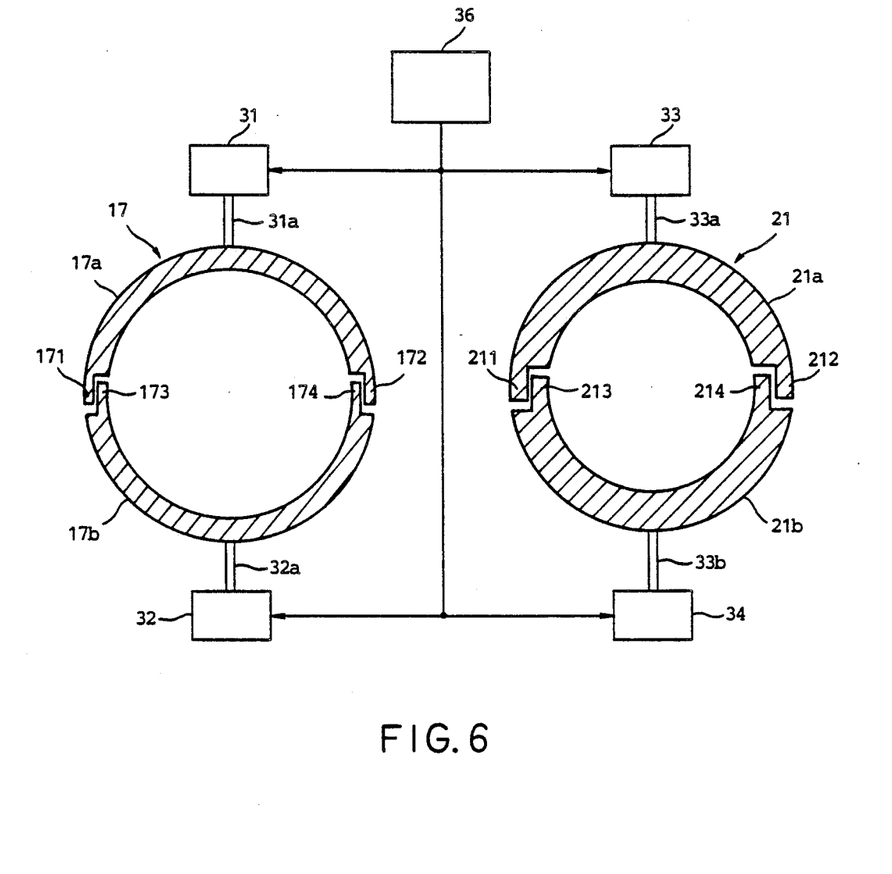
FIG. 6 is cross sectional views of first and third tube sections illustrated in FIG. 5.

Referring to FIG. 6 afresh and FIG. 5 again, the first tube section 17 is divided into first and second semicircular tubes 17a and 17b in section. Therefore, the first and the second semicircular tubes 17a and 17b are movable to upward and downward directions of FIG. 6. Similarly, the third tube section 21 is divided into third and fourth semicircular tubes 21a and 21b in section. Like the first and the second semicircular tubes 17a and 17b, the third and the fourth semicircular tubes 21a and 21b are movable upwards and downwards of FIG. 6 by means of a moving mechanism.

The first semicircular tube 17a has first and second thin portions or edges 171 and 172 placed at both ends thereof and extended along the irradiating direction. The first and the second edges 171 and 172 form a part of an outer wall of the first tube section 17. Likewise, the second semicircular tube 17b has third and fourth thin portions or edges 173 and 174 placed at both ends thereof and extended along the irradiating direction. The third and the fourth edges 173 and 174 form a part of the inner wall of the first tube section 17.

Before the first and the second semicircular tubes 17a and 17b are moved upwards and downwards of FIG. 6, respectively, the first and the third edges 171 and 173 are kept in contact with each other. Likewise, the second and the fourth edges 172 and 174 are kept in contact with each other. When the first and the second semicircular tubes 17a and 17b are moved upwards and downwards of FIG. 6, respectively, the first and the second edges 171 and 172 can be engaged with the third and the fourth edges 173 and 174, respectively, to form the first tube section 17. In addition, the first semicircular tube 17a may be spaced apart from the second semicircular tube 17b by the moving mechanism. A motion range of the first and the second semicircular tubes 17a and 17b is defined by the lengths of the first through the fourth edges 171 to 174.

The third semicircular tube 21a has fifth and sixth portions or edges 211 and 212 placed at both ends thereof and extended along the irradiating direction. The fifth and the sixth edges 211 and 212 form a part of an outer wall of the third tube section 21. Likewise, the fourth semicircular tube 21b has seventh and eighth thin portions or edges 213 and 214 placed at both ends thereof and extended along the irradiating direction. The seventh and the eighth edges 213 and 214 form a part of the inner wall of the third tube section 21.

Before the third and the fourth semicircular tubes 21a and 21b are moved upwards and downwards of FIG. 6, respectively, the fifth and the seventh edges 211 and 213 are in contact with each other. Likewise, the sixth and the eighth edges 212 and 214 are kept in contact with each other. When the third and the fourth semicircular tubes 21a and 21b are moved upwards and downwards of FIG. 6, respectively, the fifth and the sixth edges 211 and 212 can be engaged with the seventh and the eighth edges 213 and 214, respectively, to form the third tube section 21. In addition, the third semicircular tube 21a may be spaced apart from the fourth semicircular tube 21b by the moving mechanism. A motion range of the third and the fourth semicircular tubes 21a and 21b is defined by the lengths of the fifth through the eighth edges 211 to 214.

Referring to FIGS. 5 and 6, the first and the second semicircular tubes 17a and 17b are connected to first and second cylinder portions 31 and 32, respectively. The first and the second cylinder portions 31 and 32 have first and second piston rods 31a and 32a, respectively. Similarly, the third and the fourth semicircular tubes 21a and 21b are connected to third and fourth cylinder portions 33 and 34, respectively. The third and the fourth cylinder portions 33 and 34 have third and fourth piston rods 33a and 34a, respectively. The first through the fourth cylinder portions 31 to 34 serves as the driving mechanism for driving the first semicircular tube 17a, the second semicircular tube 17b, the third semicircular tube 21a, and the fourth semicircular tube 21b.

The third tube section 21 is connected to the earth through a galvanometer 35. The first through the fourth cylinder portions 31 to 34 are connected to a control unit 36 which is connected to the galvanometer 35.

Like in the first embodiment, the primary electrons are emitted from the electron gun 15 to the target section 14b so as to emit secondary electrons from the target section 14b. The secondary electrons travel towards the wafer 12 along the irradiating path together with the ion beam 11. The positive electric charge on the wafer 12 is neutralized by the secondary electrons so that the positive electric charge is extinct from the surface of the wafer 12.

When the ion beam 11 collides with the wafer 12, the undesired electrons are emitted from the wafer 12 as described above. The undesired electrons almost fall within the first tube section 17 and cause an undesired electron current to flow through the ground resistor 20a and the galvanometer 20b.

Figure 7:
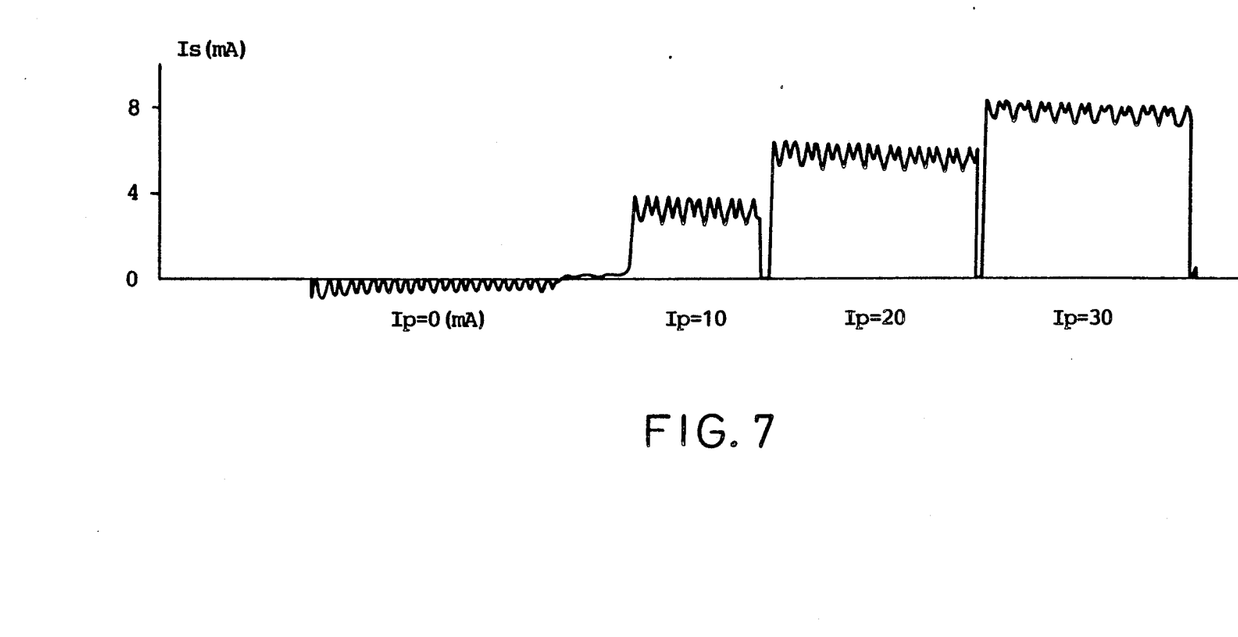
FIG. 7 is a graphical representation for use in describing an operation of the ion implantation apparatus of FIG. 6.

Temporarily referring to FIG. 7 in addition to FIG. 5, an ion beam 11 of boron fluoride ($BF_2$) is accelerated by an ion source into an accelerated ion beam by 4 keV. The accelerated ion beam has a current of 4 mA and is irradiated to the wafer 12.

Like in FIG. 4, the secondary electron current is scarcely changed in the ion implantation apparatus illustrated in FIG. 5, as shown in FIG. 7.

Referring back to FIG. 6 together with FIG. 5, it is possible to change a size of a hollow space by moving the first and the second semicircular tubes 17a and 17b in the above-mentioned manner. This shows that the size of the hollow space may be changed in dependency upon a diameter of the ion beam. Specifically, when the diameter of the ion beam 11 is expanded, the ion beam may collide with the inner wall of the third tube section 21. In this event, parasitic electrons are emitted from the inner wall of the third tube section 21 due to collision of the expanded ion beam. The parasitic electrons are irradiated onto the wafer 12. As a result, the wafer 12 is changed or electrified into a negative electric charge. In this case, a parasitic electron current is generated in the third tube section 21.

The parasitic electron current flows through the galvanometer 35 to the ground. The galvanometer 35 detects the amount of the parasitic electron current to produce a detection signal representative of the amount of the parasitic current. The detection signal is delivered to the control unit 36. When supplied with the detection signal, the control unit 36 produces a driving signal in accordance with the amount of the parasitic electron current which is indicated by the detection signal. The driving signal is supplied to the first through the fourth cylinder portions 31 to 34.

More specifically, the first and the third cylinder portions 31 and 33 drive the piston rods 31a and 33a upwards of FIG. 6 in response to the driving signal. Similarly, the second and the fourth cylinder portions 32 and 34 drive the piston rods 32a and 33a downwards of FIG. 6 in response to the driving signal. Thus, when the first and the third semicircular tubes 17a and 21a are moved upwards of FIG. 6 while the second and the fourth semicircular tubes 17b and 21b are moved downwards of FIG. 6, the internal hollow space becomes wide. As a result, the ion beam 11 does not collide with the inner wall of the third tube section 21. Accordingly, it is possible to avoid emission of the parasitic electrons from the inner wall of the third tube section 21. Therefore, the negative electric charge is hardly charged or electrified on the wafer 12 with this structure.

Figure 8A:
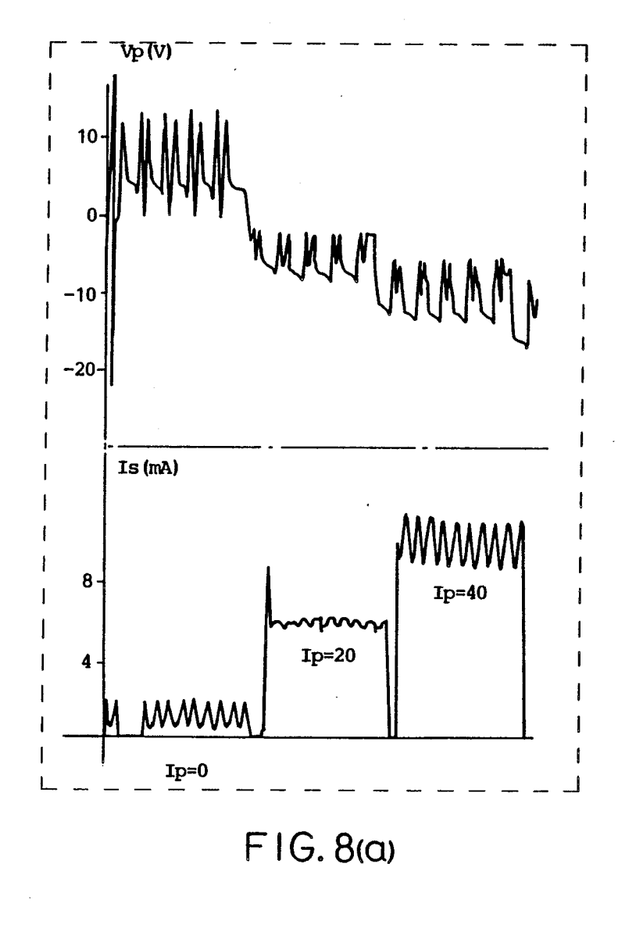
FIG. 8 is a graphical representation for use in describing a relationship between an amount of negative electrification on a substrate and an amount of a secondary current in the ion implantation apparatus illustrated in FIG. 6.

Referring to FIGS. 8(a) and (b) in addition to FIGS. 5 and 6, description will be made as regards preventing electrification of the negative electric charge on the wafer 12. In FIGS. 5 and 6, an ion beam of arsenic (As) is introduced into the apparatus illustrated in FIGS. 5 and 6. When the diameter of the ion beam is expanded, the ion beam objectionably collides with the inner wall of the third tube section 21 unless the internal hollow space is widened. Consequently, the parasitic electrons are emitted from the inner wall of the third tube section 21. Thus, the negative electric charge is electrified on the wafer 12 in the above-mentioned manner.

In order to avoid such emission of the ion beam, the internal hollow space is widened in this embodiment. For this purpose, the first and the third tube sections 17 and 21 are controlled by driving the first through the fourth cylinder portions 31 to 34. Although an amount of the negative electric charge depends on the amount of the secondary electrons, an increase of the negative electric charge can be avoided because the amount of the secondary electrons is accurately controlled in accordance with the amount of the secondary current without the parasitic electrons.

Referring to FIGS. 5 and 8 again, let the ion beam collide with the inner wall of the third tube section 21 due to the fact that the diameter of the third tube section 21 is smaller than that of the ion beam. In this event, parasitic electrons are emitted from the third tube section 21, as mentioned before. The parasitic current results from emission of the parasitic electrons and is caused to flow through the third tube section 21, as shown in FIG. 8(a), when the primary electron current is equal to 0 mA. As readily understood from FIG. 8(a), electrification voltage (Vp) on the wafer 12 is drastically varied between 10 volts and −20 volts. Such a drastic variation results from the parasitic electrons.

In this condition, the secondary electrons are emitted from the second tube section 18 and travel towards the wafer 12 when the primary electron current (Ip) of 20 mA is supplied to the electron gun 15. As a result, the electrification voltage (Vp) of the wafer 12 is less than 0 V and is alternatingly changed between about 0 V and about −10 V. Similarly, the electrification voltage (Vp) is alternatingly changed between about −5 V and −15 V when the primary electron current (Ip) is equal to 40 mA.

Figure 8B:
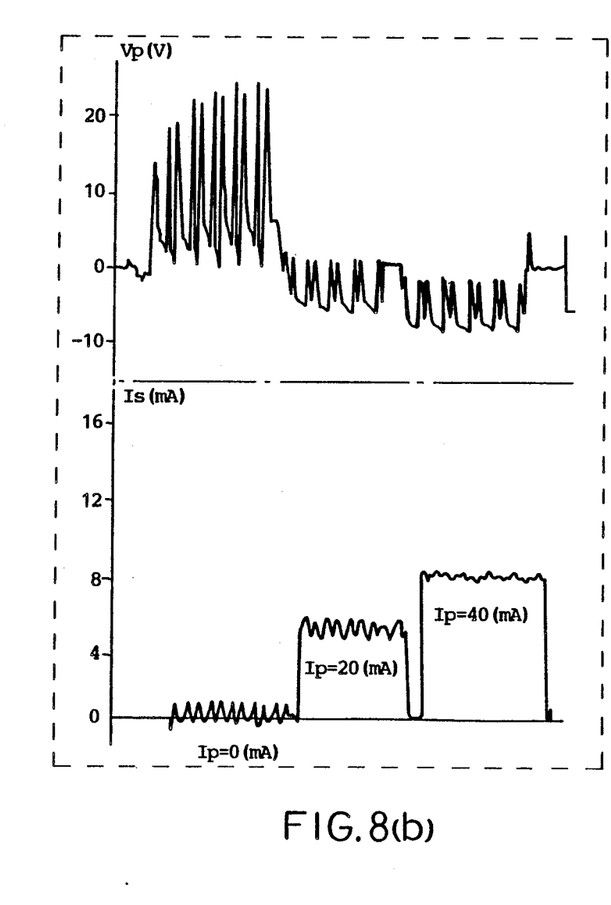

On the other hand, the parasitic electron current is hardly caused to flow through the third tube section 21, as shown in FIG. 8(b), when the diameter of the third tube section 21 is adjusted so that the ion beam does not collide with the inner wall of the electric conductor tube 14. When the primary current (Ip) is equal to 0 mA, the positive electric charge is electrified on the surface of the wafer 12 by the ion beam 11 since the secondary electrons are not emitted from the second tube section 18. In this event, the electrification voltage (Vp) is alternatingly varied at the range of about 20 V in accordance with an amount of the positive electric charge.

In this connection, the secondary electrons are emitted from the second tube section 18 and are transferred to the wafer 12 when the primary current (Ip) of 20 mA is supplied to the electron gun 15. As a result, the electrification voltage (Vp) is alternatingly varied between about 0 V and about −5 V. Similarly, the electrification voltage (Vp) is alternatingly varied between about 0 V and −5 V when the primary electron current (Ip) is equal to 40 mA.

What is claimed is:

1. In an ion implantation apparatus for injecting an ion beam into a substrate by guiding said ion beam in a predetermined direction, said substrate being located on a disk section transversely of said predetermined direction, said ion implantation apparatus comprising an electric conductor tube which is extended along said predetermined direction and which has an inner wall operable as a target section, electron supplying means for supplying said target section with a primary electron to emit a secondary electron from said target section and to thereby irradiate said secondary electron to the substrate, the improvement wherein said electric conductor tube comprises:

a first tube section located in proximity of said disk section;

a second tube section which is electrically insulated from said first tube section and which is remote from said disk section in comparison with said first tube section in said predetermined direction; said second tube section being used as said target section; and ground means for grounding said first tube section to ground.

2. An ion implantation apparatus as claimed in claim 1, wherein said ground means comprises:

a ground resistor for connecting said first tube section with earth; and a galvanometer for measuring an electric current passing through said ground resistor.

3. An ion implantation apparatus as claimed in claim 2, wherein said ground means further comprises:
bias voltage supplying means for supplying a bias voltage to said first tube section so as to keep an electric potential at a predetermined potential.

4. In an ion implantation apparatus for injecting an ion beam into a substrate by guiding said ion beam in a predetermined direction, said substrate being located on a disk section transversely of said predetermined direction, said ion implantation apparatus comprising an electric conductor tube which is extended along said predetermined direction and which has an inner wall operable as a target section, electron supplying means for supplying said target section with a primary electron to emit a secondary electron from said target section to thereby irradiate said secondary electron to the substrate, the improvement wherein said electric conductor tube comprises:
a first tube section located in proximity of said disk section, said first tube section being divided into first and second tube parts along said predetermined direction, said first and said second tube parts being movable to a prescribed direction perpendicular to said predetermined direction;
a second tube section which is electrically insulated from said first tube section and which is remote from said disk section in comparison with said first tube section in said predetermined direction, said second tube section being used as said target section;
a third tube section which is electrically insulated from said second tube section and which is farther from said disk section than said second tube section in said predetermined direction, said third tube section being divided into third and fourth tube parts along said predetermined direction, said third and said fourth tube parts being movable to said prescribed direction; and
ground means for grounding said first tube section to ground;
said ion implantation apparatus further comprising:
moving means for moving said first through said fourth tube parts along said prescribed direction.

5. An ion implantation apparatus as claimed in claim 4, wherein said moving means comprises:
measuring means for measuring a generated current in said third tube section in relation with said ion beam to produce position signal representative of relationship between said third tube section and said ion beam; and
driving means responsive to said position signal for driving said first through said fourth tube parts along said prescribed direction.

6. An ion implantation apparatus as claimed in claim 5, wherein said ground means comprises:
a ground resistor for connecting said first tube section with ground; and
a galvanometer for measuring an electric current passing through said ground resistor.

7. An ion implantation apparatus as claimed in claim 6, wherein said ground means further comprises:
bias voltage supplying means for supplying a bias voltage to said first tube section so as to keep an electric potential at a predetermined potential.

* * * * *